United States Patent [19]

Lepselter et al.

[11] Patent Number: 4,675,715
[45] Date of Patent: Jun. 23, 1987

[54] SEMICONDUCTOR INTEGRATED CIRCUIT VERTICAL GEOMETRY IMPEDANCE ELEMENT

[75] Inventors: Martin P. Lepselter, Summit; Ashok K. Sinha; Sheila Vaidya, both of New Providence, all of N.J.

[73] Assignee: American Telephone and Telegraph Company, AT&T Bell Laboratories, Murray Hill, N.J.

[21] Appl. No.: 785,030

[22] Filed: Oct. 7, 1985

Related U.S. Application Data

[63] Continuation of Ser. No. 448,354, Dec. 9, 1982.

[51] Int. Cl.$^4$ ............................................ H01L 29/04
[52] U.S. Cl. ...................................... 357/59; 357/15; 357/43; 357/34; 357/67 S; 357/71 S; 357/2
[58] Field of Search ................ 357/59 A, 59 R, 15 A, 357/43, 45, 44, 34, 23.5, 23.6, 92, 1, 2, 67 S, 71 S, 59 F

[56] References Cited

U.S. PATENT DOCUMENTS

| | | | |
|---|---|---|---|
| 3,585,412 | 6/1971 | Hodges et al. | 357/15 X |
| 3,624,467 | 11/1971 | Bean et al. | 357/59 X |
| 4,191,964 | 3/1980 | Kant | 357/51 |
| 4,274,891 | 6/1981 | Silvestri et al. | 357/44 X |
| 4,291,322 | 9/1981 | Clemens et al. | 357/59 X |
| 4,297,721 | 10/1981 | McKenny et al. | 357/59 |
| 4,324,038 | 4/1982 | Chang et al. | 29/571 |
| 4,332,070 | 6/1982 | Kant | 357/15 X |
| 4,343,082 | 8/1982 | Lepselter et al. | 357/67 S X |
| 4,377,031 | 3/1983 | Goto et al. | 357/15 X |
| 4,392,298 | 7/1983 | Barker et al. | 29/577 C |
| 4,416,049 | 11/1983 | McElroy | 357/59 X |
| 4,417,385 | 11/1983 | Temple | 357/59 X |
| 4,420,766 | 12/1983 | Kasten | 357/59 |
| 4,433,202 | 2/1986 | Maruyama et al. | 357/59 X |

FOREIGN PATENT DOCUMENTS 57-201070 12/1982 Japan .................................. 357/59

OTHER PUBLICATIONS

Kamins et al., "Hydrogenation of Transistors Fabricated in Polycrystalline-Silicon Films", IEEE Electron Device Letters, vol. ED 2-1, No. 8, Aug. 1980, pp. 159-161.
T. Ohzone et al., "A 2Kx8-Bit Static Ram", IEEE International Electron Device Meeting, Technical Digest, Dec. 4-6, 1978, pp. 360-363.
S. Harada et al., "Invited: A Novel Planar Multilevel Interconnection Technology Utilizing Polyimide", Supplement to the Journal of the Japan Society of Applied Physics, vol. 44, 1975, pp. 297-302.

Primary Examiner—Andrew J. James
Assistant Examiner—William A. Mintel
Attorney, Agent, or Firm—David I. Caplan

[57] ABSTRACT

A resistive load element comprises a Schottky barrier metal layer formed on the top surface of a doped p-type polycrystalline silicon (polysilicon) plug contacting a surface n+ zone located in a semiconductor body at a major horizontal surface thereof. The Schottky barrier metal layer is advantageously essentially a metal compound, such as titanium nitride, which does not react with the polysilicon and which forms a Schottky barrier contact with the polysilicon top surface of the plug. The polysilicon plug extends vertically down to the n+ zone through an aperture in an insulating layer that coats the major surface of the semiconductor body. The top surface of the Schottky barrier layer is coated with another metal layer, such as aluminum, for interconnection purposes. A pair of such elements can be integrated as loads, for example, in a static random access memory ("flip-flop") cell.

24 Claims, 5 Drawing Figures

SEMICONDUCTOR INTEGRATED CIRCUIT VERTICAL GEOMETRY IMPEDANCE ELEMENT

This application is a continuation of application Ser. No. 448,354, filed Dec. 9, 1982.

FIELD OF THE INVENTION

This invention relates to semiconductor integrated circuits, and more particularly to such circuits which include impedance elements.

BACKGROUND OF THE INVENTION

Semiconductor impedance elements find a wide variety of uses in semiconductor integrated circuits in both MOS (Metal Oxide Semiconductor) and bipolar technology. For example, U.S. Pat. No. 4,297,721, entitled "Extremely Low Current Load Device for Integrated Circuit" and issued on Oct. 27, 1981 to V. C. McKenny et al, disclosed an impedance element used as a load element in a flip-flop type of memory cell with cross-coupled MOS driver transistors. The impedance element took the form of an undoped horizontal strip portion of intrinsic (high resistance) polycrystalline silicon (polysilicon) bounded at both ends by extrinsic (doped) polysilicon strip portions for interconnecting the high resistance polysilicon strip portion both to a power supply node and to a data node of the flip-flop. Such an impedance element, however, has several disadvantages: (1) it requires an extra masking and lithographic step to define the boundaries between the intrinsic and extrinsic polysilicon portions; (2) it requires that the feature size of the mask that defines the distance between these boundaries be undesirably large, to wit, at least about 8 microns in the case of the disclosed subsequent annealing temperature of about 1100 degrees C., (corresponding to about 5 microns for an anneal of about 1000 degrees C.), lest the resulting diffusion of impurities during anneal should destroy (short out) the intrinsic region; and (3) it is not feasible to reduce the transistor gate electrode resistance, as is desirable, by depositing metal silicide over the extrinsic polysilicon portions, because of the uncertainty of the boundaries (after diffusion) of the intrinsic portions and hence because of the concomitant problem of undesirably electrically shorting out the intrinsic portions during deposition of the metal silicide.

On the other hand, Schottky barrier diodes have been taught as useful impedance elements in a flip-flop memory cell. See, for example, U.S. Pat. No. 3,585,412 issued to D. A. Hodges et al on June 15, 1971 entitled "Schottky Barrier Diodes as Impedance Elements." The Schottky diodes in that patent were disclosed as being formed by a suitable refractory metal layer in rectifying Schottky barrier contact with a localized n or p type surface zone at a major surface of an underlying semiconductive silicon body. In MOS transistor circuits, however, such diodes would require added precious semiconductor area or else would not readily provide the diode directionality desired in certain applications as, for example, in a static random access memory element having the form of a flip-flop memory cell using N-MOS (N-channel MOS) transistors.

It would therefore be desirable to have an impedance element, such as a load element, which mitigates the above-mentioned problems and which is suitable for incorporation in a flip-flop memory cell. In designing such an element, it is important to recognize the problem of poor step coverage caused by deposition of certain materials which do not deposit conformally over non-planar surfaces, especially metallization materials required for interconnecting various elements of the circuit.

SUMMARY OF THE INVENTION

A structure including a vertical geometry impedance element, which mitigates these problems, comprises a polycrystalline silicon (polysilicon) plug (e.g., 12) which substantially fills an aperture in an insulating layer (e.g., 11) located on a horizontal major planar surface (e.g., 10.1) of a semiconductive silicon body (e.g., 10), whereby the polysilicon plug directly contacts the silicon body at a portion of its major surface at the bottom of the aperture. Advantageously, the thickness of the insulating layer is subsantially uniform at least in the vicinity of the aperture, so that its top surface is substantially planar thereat. Advantageously also, the aperture has steep vertical sidewalls, and the grain boundaries in the polysilicon plug run horizontally in those regions of the plug in the aperture situated outside an isosceles right triangle (e.g., 12.5) whose hypotenuse (e.g., d) is the maximum width of the bottom of the aperture. Thus, the grain boundaries run vertically in the plug only in the region inside the right triangle, and hence these grain boundaries run substantially solely horizontally in the plug in regions thereof whose distances above the surface of the underlying silicon body are greater than one-half the width (e.g., d) of the aperture filled by the plug. Thus, undesirable migration or diffusion of impurities through the polysilicon plug along grain boundaries down to the underlying semiconductor is suppressed by making the vertical thickness of the insulating layer and hence the vertical height of the plug equal to at least, and preferably greater than, one-half the width of the aperture.

Advantageously, the top surface of the polysilicon plug is smooth and level with the top (horizontal) surface of the insulating layer which is also advantageously smooth, whereby the exposed top surface presented by the structure (top surfaces of the insulating layer and polysilicon plug) is substantially planar and smooth. As mentioned above, a substantially planar exposed top surface of the structure is desirable for mitigating the problem of poor step coverage encountered when certain other materials, notably aluminum used for circuit interconnection metallization, are deposited onto the top exposed surface of the structure. The impedance element thus advantageously further comprises a layer of material directly or indirectly contacting this top exposed surface, the nature of the layer and of the contacting (direct vs. indirect) depending upon the desired electrical properties of the impedance element. In one embodiment of the invention, this layer of material can be a metallization layer (such as aluminum) indirectly contacting the polysilicon plug, a layer of a metal compound (preferably refractory) of substantially uniform thickness intervening between the plug and the metallization layer, the layer of metal compound overlying contiguous with, and in Schottky barrier contact with, the top surface of the polysilicon plug. By "refractory" is meant that the melting point is at least about 750 degrees C., in order to withstand subsequent processing at such a temperature as required for annealing or gettering. The polysilicon plug is doped with conductivity type determining impurities of second opposite type from that (hereinafter called first type) of a zone or region of the semiconductor body contiguous with the portion of its major surface at the bottom of the aperture in the insulating layer (i.e., where the polysilicon plug directly contacts the silicon body), whereby the resulting vertical impedance element can serve as a Schottky barrier "load" element.

As for the choice of refractory metal compound for the layer ("Schottky layer") in Schottky barrier contact with the polysilicon plug, it has been observed that certain metal compounds—such as titanium nitride—form Schottky barriers with polysilicon. These metal compounds thus can advantageously be used for the Schottky layer because they have the advantage that they do not chemically react with the polysilicon to form undesirable spikes in the Schottky barrier profile formed by the boundary of the metal compound Schottky layer and the polysilicon, that is, spikes which would penetrate down into the underlying silicon body and undesirably degrade the low current reverse bias characteristic of the Schottky barrier. Moreover, since the grain boundaries run horizontally in certain regions as mentioned above, it follows that provided the polysilicon plug has a vertical height greater than one-half the width of the aperture in the insulating layer, impurities in the metal compound cannot readily, if at all, undesirably diffuse downward along the polysilicon grain boundaries and into the underlying silicon body and thereby degrade any underlying semiconductor zone thereat and thereby undesirably increase the leakage current of any underlying $n^+p$ junction.

In another embodiment of the invention, the layer intervening between the metallization layer and the polysilicon plug can be an intermetallic compound which forms a Schottky barrier contact with the plug. Alternatively, the metallization layer (such as aluminum) can directly contact the polysilicon plug, and the plug is doped with conductivity type determining impurities of the first type, i.e., the same type as that of the region of the silicon body contiguous with the portion of its major surface where the polysilicon plug directly contacts the silicon body (i.e., at the bottom of the aperture in the insulating layer). In this way an essentially low impedance (indirect) ohmic contact is formed between the metallization layer and the region of the silicon body.

In a specific embodiment of the invention, the first type conductivity is $n^+$ semiconductive silicon and the plug is essentially p-type polycrystalline silicon, the metal compound is essentially titanium nitride, and this metal compound is interconnected to other circuit elements by means of an overlying metallization layer of aluminum. In another specific embodiment, the impedance element is incorporated into an R-S type flip-flop memory cell with MOS driver transistors. In this way, no separate carefully geometrically controlled lithographic step is required to form the impedance element apart from forming the contact windows already required for interconnecting the power source to the memory cell.

BRIEF DESCRIPTION OF THE DRAWING

This invention, together with its features, objects, and advantages, may be better understood from the following detailed description when read in conjunction with the drawing in which.

Only for the sake of clarity, none of the drawings is to any scale.

DETAILED DESCRIPTION

Figure 1:
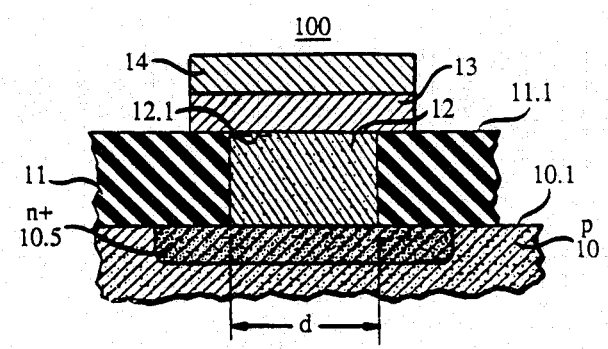
FIG. 1 is a side view in cross section of an impedance element in accordance with a specific embodiment of the invention.

FIG. 1 shows an impedance element 100 integrated in a semiconductor body 10. The body 10 is essentially p-type monocrystalline semiconductive silicon which has a major horizontal surface 10.1. A localized $n^+$ conductivity type zone 10.5 is located in the body contiguous with the major surface. An insulating layer 11 coats the major surface 10.1 except at an aperture filled with a p-type polysilicon plug layer 12. Typically, the insulating layer 11 is essentially silicon dioxide grown from TEOS (tetra-ethyl-ortho-silicate), situated over a field oxide (silicon dioxide) layer. The aperture has steep vertical walls and overlies the $n^+$ zone 10.5. The width of the aperture, and hence of the plug 12, is denoted by d. The top surface 12.1 of the polysilicon plug 12 is substantially flush or level (planar) with the top surface 11.1 of the insulating layer 11. On top of this plug 12 is located a titanium nitride layer 13 making Schottky barrier contact with the plug 12 at the top surface 12.1 thereof. Finally, on top of the titanium nitride layer 13 is located an aluminum metallization layer 14 ordinarily making essentialy ohmic contact with the titanium nitride layer 13.

In order to fabricate the impedance element 100, the p-type silicon body 10 (FIG. 2) is prepared with the localized $n^+$ zone 10.5 by standard techniques in N-MOS technology, typically by doping the silicon body thereat with antimony (alternatively arsenic) to yield a surface resistance of about 30 to 50 ohms per square, so that this $n^+$ zone 10.5 can serve as a source or drain region for an N-MOS transistor. The insulating layer 11 is formed to a substantially uniform thickness of about 0.5 micron. The top surface of the insulating layer 11 is substantially planar, as can be achieved by plasma planarization, for example. The insulating layer 11 is provided with an aperture of maximum width d of about 1 micron, typically, by means of standard reactive ion etching of the insulating layer while the latter is protectively and selectively masked against the etching, i.e., masked except at the desired location of the aperture. Then the polysilicon layer 12 is deposited, typically by means of relatively low pressure chemical vapor deposition, illustratively at a total vapor pressure of less than about 1 Torr, at a temperature of about 660 degrees C., using a chemical vapor of silane ($SiH_4$). Note in FIG. 2 the boundary 12.5, in the form of an isosceles right triangle, thereby formed at the intersection between the region of the polysilicon layer 12 in the aperture where the grain boundaries run horizontally and the region where they run vertically. Thus, the apex of the boundary 12.5 is located at a distance d/2 from the surface of the body 10.

Figure 2:
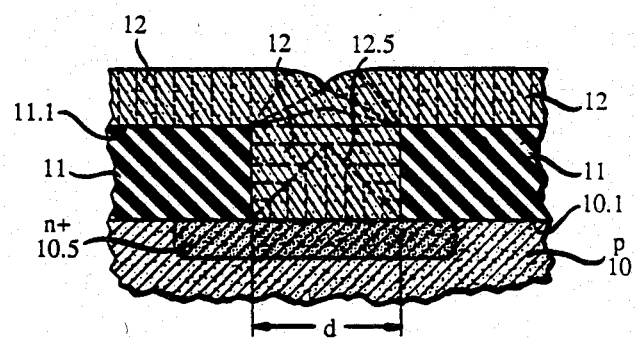
FIG. 2 is a side view in cross section of the impedance element of FIG. 1 at an earlier stage of fabrication.

Low pressure chemical vapor deposition of polysilicon on the insulating layer has the advantage that the deposited polysilicon grows isotropically (at the same rate) from all exposed surfaces—horizontal and vertical—of the insulating layer. In this way, the aperture is completely filled with polysilicon after a sufficient deposition time. Meanwhile, the grain boundaries in the deposited polysilicon tend to form along directions perpendicular to the local surface of the insulating layer, as indicated in FIG. 2.

Next, the polysilicon layer is implanted with boron ions, typically of about 30 KeV energy, to a dose of typically about $7 \times 10^{11}$ ions per square centimeter. The thus boron doped polysilicon layer is then coated with a "capping" layer (not shown) to minimize outdiffusion of the boron and is then annealed, typically for about 30 minutes at about 1000 degrees C. The capping layer is typically also polysilicon, but can instead be silicon dioxide, silicon nitride, or other conveniently deposited material which minimizes outdiffusion of boron from the polysilicon layer 12. The capping layer and the polysilicon are then etched. Advantageously, the etching of the polysilicon is done anisotropically, particularly in case the top surface of the polysilicon layer is not planar. Advantageously also, the anisotropic etching process is of the kind which, at an early etching stage thereof, tends to fill crevices in the polysilicon by redepositing by-products (such as those sputtered from the polysilicon) onto the sidewalls of the crevices. Such anisotropic etching can be accomplished, for example, by exposure of the polysilicon to a low-pressure (about 30 milli-torr or less) chlorine plasma, for a sufficient time to remove sufficient polysilicon to expose the top surface 11.1 of the insulating layer 11. Thereby a planarized structure results, i.e., a structure in which the top surface 11.1 of the insulating layer 11 and the top surface 12.1 (FIG. 1) of the remaining polysilicon plug 12 together form a relatively smooth or planar structure.

Next, a titanium nitride layer is deposited to a substantially uniform thickness of typically about 350 Angstroms on the thus planarized structure, and an aluminum layer typically about 1 micron thick is then deposited on the resulting substantially planar exposed top surface of the titanium nitride layer. For example, the titanium nitride is deposited by reactive sputtering, such as by sputtering from a target of titanium in a nitrogen ambient while the structure being built is held at a temperature in the approximate range of 50 to 60 degrees C. The aluminum layer is then deposited by evaporation, typically at a temperature of about 300 degrees C. The aluminum and titanium nitride layers are then patterned (selectively masked and etched) to form a patterned titanium nitride layer 13 and a patterned aluminum layer 14 in accordance with the desired interconnection pattern of the desired integrated circuit.

With an aperture of about 1 micron $\times$ 1 micron square, the reverse (leakage) current under a 5 volt potential from the (positively poled) aluminum layer 14 to the n$^+$ zone 10.5 has been found to be typically about 1 nanoampere, a useful value for use of the vertical structure as a load element in a flip-flop N-MOS memory cell. Specifically, an N-MOS transistor of this size is characterized by a leakage current of about $10^{-2}$ nanoamperes or less (as is consistent with a theoretical model for a Schottky barrier height of about 0.5 volt, i.e., of about one-half the bandgap of the polysilicon semiconductor), and is further characterized by the desirably higher current of 1 nanoampere or less passed by the impedance element under the 5 volts corresponding to the desirably high resistance of 5000 megohms or more, and corresponding to a desirably low power consumption of 5 nanowatts or less per cell.

The impedance element 100 can therefore be adapted for incorporation in a flip-flop memory cell comprising a pair of cross-coupled N-MOS transistors, each having a relatively thin gate oxide thickness of about 250 Angstroms, for example. In such a case, the insulating layer 11 has a thickness typically in the range of about 8,000 to 10,000 Angstroms. The polysilicon layer 12 is formed after the gate electrodes, as well as the source and drain regions, have been formed but before the apertures (or "contact windows") in the portions (not shown) of the insulating layer 11 coating the gate electrodes have been formed for contacting these gate electrodes.

Note that, in case it is desired to form an essentially ohmic connection between the aluminum layer 14 and the n$^+$ zone 10.5, the titanium nitride layer 13 can be omitted and the polysilicon plug 12 doped to n$^+$ type conductivity. Again, the horizontal grain boundaries in the n$^+$ polysilicon plug serve to suppress unwanted diffusion of impurities from the aluminum down to the silicon body 10 where such impurity diffusion could undesirably degrade the n$^+$p junction.

Figure 5:
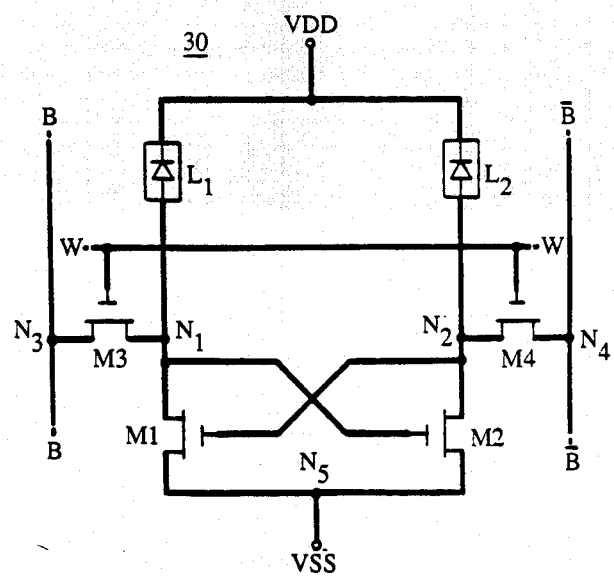
FIG. 5 is a circuit schematic of the layout diagram of FIG. 3.
Figure 3:
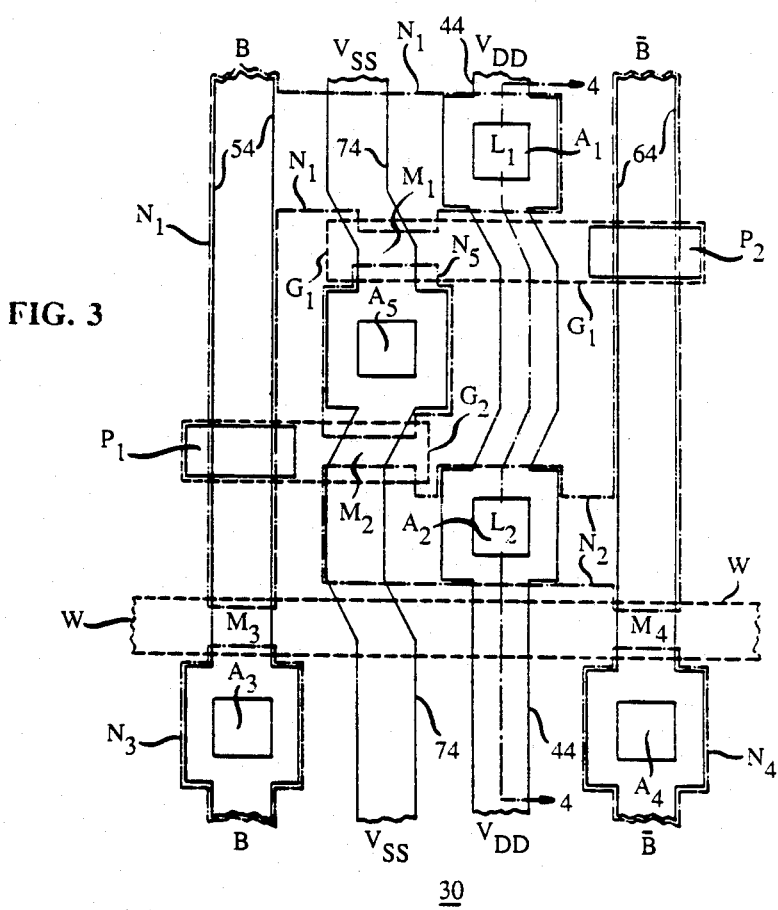
FIG. 3 is a top view layout diagram of an integrated circuit R-S flip-flop memory cell with impedance elements in accordance with the invention.
Figure 4:
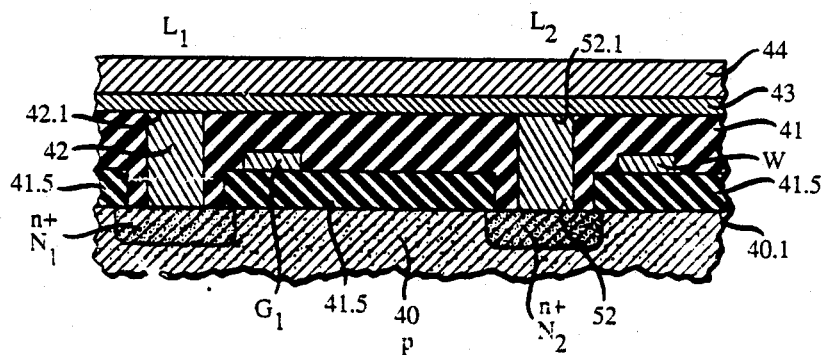
FIG. 4 is a diagram of a specifically indicated cross section of FIG. 3.

FIG. 3 shows a proposed layout of a static random access memory element 30 including a pair of load elements L$_1$ and L$_2$ each in accordance with the invention. A schematic circuit diagram of this memory element 30 is shown in FIG. 5, and a cross section taken along line 4—4 of FIG. 3 is shown in FIG. 4. Elements of FIG. 3 which are illustrated in FIG. 5 are denoted with the same identifying labels. Elements in FIGS. 3 and 4 corresponding to elements in FIG. 1 are given the same reference numerals plus 30. In FIG. 3 equispaced dashed lines represent first level polycrystalline silicon electrode interconnections, solid lines represent second level aluminum metallization, and dot-dashed lines represent n$^+$ impurity zones at the surface of an underlying single crystal semiconductive silicon body 40 whose conductivity type in the neighborhood of a major surface 40.1 is essentially p-type owing to a substantially uniform acceptor impurity concentration of typically about $10^{15}$ atoms/cm$^3$. The major surface 40.1 of the body 40, typically oriented $<100>$, is coated—except at apertures (or "windows") A$_1$ . . . A$_5$, and P$_1$, P$_2$—with an insulating layer 44 which has field oxide portions 41.5. The thickness of the insulating layer 41 is illustratively about 10,000 Angstroms; and of the field oxide 41.5, about 3,500 Angstroms. The top surface of the insulating layer is advantageously substantially planar, as obtained by plasma planarization of the insulating layer, for example. Ordinarily, as known in the art, a channel suppressing region ("chan-stop") of p$^+$ conductivity type (not shown) is formed by suitable ion implantation, typically of boron ions, in the semiconductor body 40 at its interface with the field oxide 41.5.

Bit line B and its complementary bit line $\overline{B}$ are formed by, respectively, aluminum metallization strips 54 and 64. Each of these bit lines B and $\overline{B}$ connects to an underlying n$^+$ or zone by way of separate windows A$_3$ and A$_4$, respectively, in an insulating layer 41 overlying the body 40 to a separate n$^+$ conductivity type zone N$_3$ and N$_4$, respectively. Each of these nodes N$_3$ and N$_4$ serves as a corresponding node in the electrical circuit shown in FIG. 5. A wordline W is located on field oxide portion 41.5 and thus is spaced illustratively about 3,500 Angstroms from the surface 40.1 except at areas where the wordline passes over gate oxide where it serves as a gate electrode for a transistor. This wordline is thus formed by first level polysilicon, and in part (the parts which are spaced about 250 Angstroms from the surface 40.1) thus serves as gate electrodes for a transistor $M_3$ and a transistor $M_4$. The transistors $M_3$ and $M_4$ serve as data access transistors to the memory cell 30.

Cross-coupled transistors $M_1$ and $M_2$, respectively, have their source terminal zones formed by different portions of an n+ zone $N_5$ at the surface of the body 40, their gate electrodes by first level polysilicon strips $G_1$ and $G_2$, respectively, and their drain terminal zones by n+ zones $N_1$ (also denoted by 40.5) and $N_2$, respectively. By "cross-coupled" is meant that an input (gate) terminal of each of the transistors is connected to an output (drain) terminal of the other. A second level aluminum metallization strip 74 connects terminal $V_{SS}$ to node $N_5$, by way of the aperture $A_5$ through the insulating layer 41 filled with n+ conductivity type polysilicon. Portions of n+ zone $N_5$ also serve as source regions for cross-coupled transistors $M_1$ and $M_2$, that is, each of whose polysilicon gate electrode metallizations $G_1$ and $G_2$ is conductively coupled to the other's drain zone (a portion of n+ zones $N_1$ and $N_2$, respectively) by way of buried contact (or "polycon" contact) windows $P_1$ and $P_2$ filled with n+ doped polysilicon plugs as known in the art. These plugs connect the first level polysilicon gate electrode metallization $G_2$ and $G_1$ to the underlying n+ zones $N_1$ and $N_2$, respectively, and are doped with donor impurities, such as arsenic, so as to provide high conductivity interconnection. They may be formed at the same time as p-type polysilicon plugs $L_1$ and $L_2$ are formed (except as to doping steps; that is, when p-type polysilicon plugs $L_1$ and $L_2$ are being doped with impurites, the windows $P_1$ and $P_2$ are not exposed to the doping source, and vice versa). Finally, a second level aluminum metallization strip 44 connects terminal $V_{DD}$ to nodes $N_1$ and $N_2$, respectively, through loads $L_1$ and $L_2$ by p-type conductivity type polysilicon plugs 42 and 52, respectively, formed in windows $A_1$ and $A_2$ through the insulating layer 33 as described above in connection with the plug 12 (FIG. 1). The loads $L_1$ and $L_2$ advantageously are thus in the form of p-type conductivity type polysilicon plugs 51 and 52, respectively, each in Schottky barrier contact at its top surface 42.1 and 52.1 with a layer 43 of titanium nitride, for example, overlaid with a metallization layer 44 of aluminum, and each plug forming a n+p junction at its bottom surface where it directly contacts an n+ zone, in accordance with the invention as described above in connection with FIGS. 1 and 2.

It should be noted that the aluminum metallization strips 54, 64, and 74 advantageously do not directly contact the underlying silicon body 40 at the bottom of the apertures $A_3$, $A_4$, and $A_5$. Advantageously, therefore, at these apertures there are electrode contacts to the silicon other than of aluminum, separating the aluminum from the underlying silicon body 40. These electrode contacts can be n+ doped polysilicon plugs with top surfaces advantageously of metal silicide, in order to avoid undesirable characteristics (such as unwanted Schottky barriers) resulting from titanium nitride directly contacting n+ doped polysilicon as conventionally used as electrode contacts to silicon in present art; otherwise, if metal silicide is not used at the top surface of the polysilicon electrodes, the aluminum strips 54, 64, and 74 (i.e., the metallization lines for B, $\overline{B}$, and $V_{SS}$) need not have any underlying layer of titanium nitride, that is, the titanium nitride can be patterned prior to the deposition of the aluminum, in which case the polysilicon plugs in the apertures $A_3$, $A_4$, and $A_5$ are advantageously formed (except for impurity type doping) in the same manner as the polysilicon plugs 42.1 and 52.1 in the apertures $A_1$ and $A_2$—that is, with a vertical height at least one-half the maximum width of the aperture so that the horizontal grain boundaries of the polysilicon tend to prevent unwanted diffusion of impurities from the aluminum down to the silicon body 10.

Although the invention has been described in terms of a specific embodiment, various modifications can be made without departing from the scope of the invention. Instead of titanium nitride for the layer 13 (forming a Schottky barrier with the polysilicon layer 12), other refractory metal compounds can be used which have a relatively high heat of formation so as not to react with the polysilicon, that is, so as not to form undesirable spikes at the interface. For example, instead of titanium nitride, such refractory metal compounds as tantalum nitride or titanium carbide, or refractory intermetallics such as a transition metal silicide, may be used. It should be understood that the body 10 or 40 need be of essentially p-type conductivity only in regions thereof contiguous with the major surface 10.1 or 40.1 extending downward and laterally for distances sufficient to encompass the n+ zones and the active (gate) regions of the transistors, as known in the art ("p-tub"). It should also be understood that p+ type polysilicon plugs can be used for ohmic contact between aluminum and p+ type localized zones at the surface of a silicon body (P-MOS technology). Moreover, insulating layers other than silicon dioxide grown from TEOS may be used, such as P-glass (phosphorus-doped silicon dioxide). If higher deposition temperatures can be tolerated in the formation of the polysilicon plug, high pressure chemical vapor deposition of the polysilicon may be used. Also, bipolar transistors may be used instead of MOS transistors. Finally, it should be understood that mirror images of the element 30 shown in FIG. 3 can be formed on each of its four sides in order to build an organized rectangular array of such memory elements with fourfold symmetry.

What is claimed is:

1. A semiconductor integrated circuit including an impedance element comprising:
    (a) a semiconductor body having a major planar horizontal surface;
    (b) an insulating layer located on the major surface;
    (c) a polycrystalline silicon plug substantially filling an aperture having substantially vertical sidewalls in the insulating layer and thereby directly contacting the major surface of the body at the bottom of the aperture, the plug having a vertical height greater than one-half the maximum width of the aperture, the grain boundaries in the plug running substantially solely horizontally in a region thereof situated at a distance of more than one-half such width from the major surface of the body, said region including a complete horizontal cross section of the aperture.

2. The circuit of claim 1 in which the plug has a semiconductor conductivity type which is opposite from that of the body at the entire portion of the major surface thereof where the plug directly contacts the body, the top surface of the plug being substantially smooth and level with the top surface of the insulating layer so that the top surface of the plug and insulating layer together form a substantially planar surface.

3. The element of claim 1 in which a layer of aluminum overlies, and directly or indirectly contacts, the top surface of the plug and in which the grain boundaries in the plug run substantially vertically in a neighborhood of the major surface of the body.

4. A semiconductor integrated circuit including an impedance element comprising:
   (a) a semiconductor body having a first conductivity type zone located at a first portion of a major planar horizontal surface of the semiconductor body
   (b) an insulating layer of substantially uniform thickness which coats the major surface, the insulating layer having at least one aperture of maximum width d with substantially vertical sidewalls which exposes a portion of said zone, the thickness of the insulating layer being equal to or greater than the maximum width d of the aperture;
   (c) a polycrystalline silicon plug of second, opposite conductivity type which substantially fills the aperture, the plug directly contacting the first conductivity type zone, the top surface of the plug being substantially smooth and level with the top surface of the insulating layer so that the top surface of the plug and insulating layer together form a substantially planar surface, and the grain boundaries in the plug running substantialy solely horizontally everywhere in the region thereof situated at a distance of more than one-half such width; and
   (d) a Schottky layer contiguous with and in Schottky barrier contact with a top surface of the plug.

5. The circuit of claim 4 in which the first conductivity type is n-type silicon and the plug is essentially p-type.

6. The circuit of claim 5 in which the Schottky layer is a compound of metal with nonmetal.

7. The circuit of claim 6 in which the metal compound is titanium nitride.

8. The circuit of claim 7 further comprising a layer of essentially aluminum directly contacting the Schottky layer and in which the thickness of the Schottky layer is substantially uniform in the region thereof underlying its surface where the layer of aluminum directly contacts it.

9. The circuit of claim 6 further comprising a layer essentially of aluminum directly contacting the Schottky layer and in which the thickness of the Schottky layer is substantially uniform in the region thereof underlying its surface where the layer of aluminum directly contacts it.

10. The circuit of claim 4 in which the Schottky layer is a compound of metal with nonmetal.

11. The circuit of claim 10 in which the metal compound is titanium nitride.

12. The circuit of claim 11 further comprising a layer of essentially aluminum directly contacting the Schottky layer and in which the thickness of the Schottky layer is substantially uniform in the region thereof underlying its surface where the layer of aluminum directly contacts it.

13. The circuit of claim 4 in which the Schottky layer is essentially an intermetallic layer.

14. The circuit of claim 13 further comprising a layer of essentially aluminum directly contacting the Schottky layer and in which the thickness of the Schottky layer is substantially uniform in the region thereof underlying its surface where the layer of aluminum directly contacts it.

15. The circuit of claim 1 in which the insulating layer is essentially silicon dioxide grown from TEOS in a neighborhood of the aperture.

16. A flip-flop memory cell comprising:
   (a) first and second transistors, each having a gate electrode that is conductively coupled to a drain zone of the other, each formed at a major horizontal surface of a semiconductor body of essentially a first conductivity type, and the drain zone of each being of second, opposite conductivity type and being located contiguous with the major surface;
   (b) an insulating layer coating the major surface;
   (c) first and second impedance elements comprising, respectively, first and second vertical polysilicon plugs of the first conductivity type formed, respectively, in first and second apertures in the insulating layer, the first and second plugs contacting the drain zone of the first and second transistors, respectively, at the respective bottoms of the plugs; and
   (d) a Schottky layer contiguous with the tops of the first and second plugs and in Schottky barrier contact therewith.

17. The cell of claim 16 further comprising an aluminum layer contacting the Schottky layer.

18. The cell of claim 16 in which the first conductivity type is n-type and the second is p-type.

19. The cell of claim 16 in which the height of each of the plugs is at least one-half the maximum width of each aperture.

20. The cell of claim 16 in which the Schottky layer is essentially a metal compound.

21. The cell of claim 20 in which the metal compound is titanium nitride.

22. The cell of claim 20 in which the metal compound is essentially tantalum nitride.

23. The cell of claim 20 in which the metal compound is essentially titanium carbide.

24. The cell of claim 18 in which the Schottky layer is essentially an intermetallic layer.

* * * * *